United States Patent [19]
Wan

[11] Patent Number: 5,952,825
[45] Date of Patent: Sep. 14, 1999

[54] MAGNETIC FIELD SENSING DEVICE HAVING INTEGRAL COILS FOR PRODUCING MAGNETIC FIELDS

[75] Inventor: Hong Wan, Maple Grove, Minn.

[73] Assignee: Honeywell Inc., Minneapolis, Minn.

[21] Appl. No.: 08/911,550

[22] Filed: Aug. 14, 1997

[51] Int. Cl.$^6$ .................................................. G01R 33/02
[52] U.S. Cl. ......................................... 324/252; 338/32 R
[58] Field of Search .......................... 324/207.21, 207.2, 324/252–260; 338/32 R–32 H

[56] References Cited

U.S. PATENT DOCUMENTS

| | | | |
|---|---|---|---|
| 4,847,584 | 7/1989 | Pant | 338/32 R |
| 5,247,278 | 9/1993 | Pant et al. | 324/252 |
| 5,583,424 | 12/1996 | Sato et al. | 323/282 |

*Primary Examiner*—Jay M. Patidar
*Attorney, Agent, or Firm*—Gregory A. Bruns

[57] ABSTRACT

An integrated magnetic field sensing device has magnetic field sensing elements arranged in an electrical bridge. A first spiral coil provides a setting and resetting function. Second and third coils are arranged to carry a common current and produce magnetic fields useful for test, compensation, calibration, and feedback applications.

6 Claims, 5 Drawing Sheets

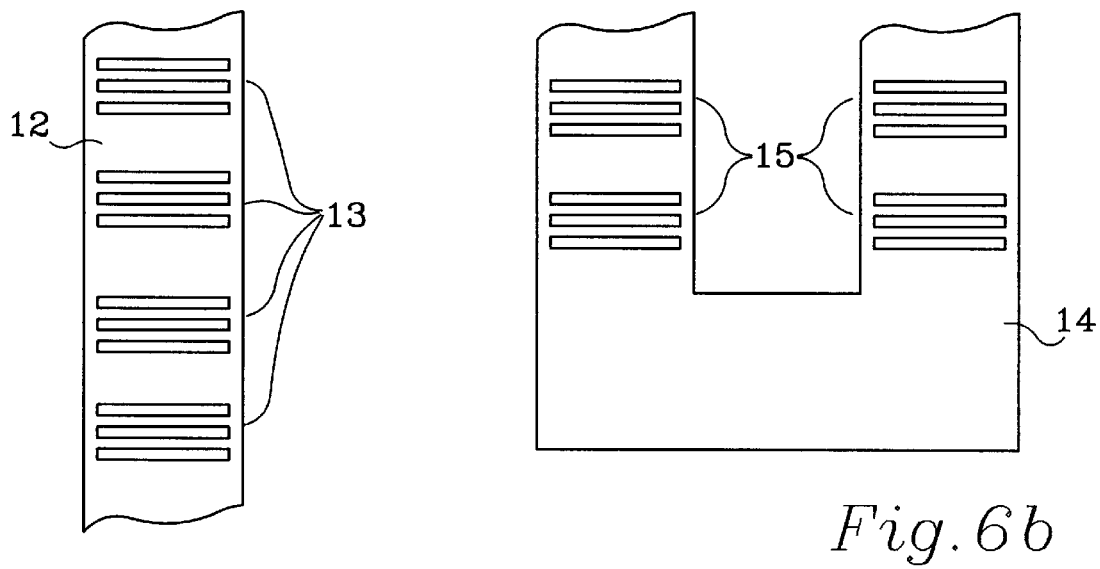
Fig.6a
Fig.6b
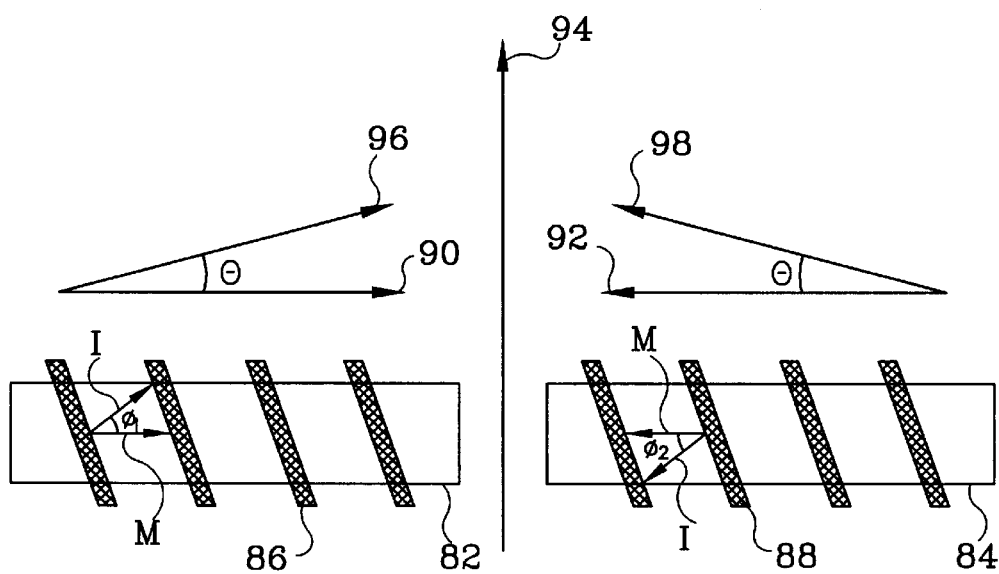
Fig.5

MAGNETIC FIELD SENSING DEVICE HAVING INTEGRAL COILS FOR PRODUCING MAGNETIC FIELDS

BACKGROUND OF THE INVENTION

The invention relates in general to magnetic field sensors and more particularly to integrated magnetic field sensors formed on a single semiconductor die and requiring the use of a magnetic field for functions such as domain setting, calibration, establishing a bias or offset magnetic field, providing a feedback field, determining a sensor transfer characteristic, or other functions requiring a magnetic field.

The invention has application to a variety of magnetic sensors or transducers. These include, but are not limited to, magnetoresistive transducers, giant and colossal magnetoresistive transducers, magnetodiodes, magnetotransistors and Hall effect transducers.

Magnetic field sensing devices may be used in many applications, including, but not limited to, solid state compassing, e.g., in automobiles; in signature detection, e.g., metal detection; and in anomaly detection, e.g., position sensing.

Solid state compassing may be used in personal items, for example, in a watch. Position sensing may be used to sense the position of a medical device, such as a catheter within the body of a patient. These and other applications have created requirements for magnetic sensing devices that are of a smaller size and that require less power than the devices of the past.

Extremely small magnetic field sensing devices can be made utilizing long thin strips of a magnetoresistive film of an NiFe material, such as Permalloy™. The magnetization of the film generally forms an angle with the current, and the resistance of the film depends on this angle. When the magnetization of the film is parallel to the current, the resistance is at a maximum, and when it is perpendicular to the current, the resistance has its minimum value. The magnetization in these films must be set in a single domain state before it is ready to sense magnetic fields. Although there may be situations where a magnetoresistive transducer can sense magnetic fields even if it is in a multiple domain state, for purposes of repeatability, it is essential that the magnetization of a magnetoresistive transducer magnetic sensing element be in a single domain state. The set-reset function is described in U.S. Pat. No. 5,247,278.

Magnetic field sensing devices may be constructed of elongated magnetoresistive strips which make up the four separate elements, or legs, of a wheatstone bridge. The legs are then oriented to be sensitive to a field perpendicular to the strips, which results in all strips being parallel in the bridge configuration. Bridge configurations which will conserve space include arranging the four elements in a single plane into a single column or row sometimes referred to as 1×4 configuration, or arranging the four elements into two side-by-side sets of two elements each; sometimes referred to as a 2×2 configuration. An illustration of a 1×4 configuration with set-reset conductor 12 and elements 13 is shown in FIG. 6a. An illustration of a 2×2 configuration with set-reset conductor 14 and elements 15 is shown in FIG. 6b. Both configurations are discussed in U.S. Pat. No. 5,247,278.

The testing, setup, compensation, or calibration of magnetic field sensing devices represents an important area. A second important area is the use of the sensing devices in a feedback control application. The function needed in both areas is the ability to produce a known magnetic field at the magnetic field sensor. This known field and the ability to vary the field allows one to measure the response of the magnetic field sensor and perform set up, sensitivity and calibration operations, and to use the sensor in feedback applications.

Thus a need exists for a simple self contained device that is very small, and requires very little power, to provide a magnetic field for setting and resetting the magnetic domains in a sensor and for producing a known magnetic field for testing, set up, and calibration, as well as for feedback applications of a magnetic field sensor.

SUMMARY

The present invention solves these and other needs by providing an extremely small, low power device, including means for setting and resetting the magnetic domains in magnetoresistive magnetic field sensing elements arranged in an electrical bridge network; and a current strap is provided for setting the directions of magnetization in opposing bridge elements in the same direction or in opposite directions depending on the particular design.

A current strap which produces a known magnetic field at the magnetic field sensing elements. The known magnetic field is used for functions such as testing, set up, compensation and calibration, as well as in feedback applications.

The present invention provides both a setting and resetting feature and the independent feature of producing a known magnetic field at the magnetic sensing elements through the use of a unique arrangement of coils. The presence of both of these features in a magnetic field sensor increases the sensor functionality far beyond the sum of the individual functions of the two features.

BRIEF DESCRIPTION OF THE DRAWINGS

FIG. 5 is a diagramatic view of magnetoresistive strips and directions of magnetization.

FIGS. 6a and 6b are diagramatic views of bridge configurations.

DESCRIPTION OF THE PREFERRED EMBODIMENT

Figure 1:
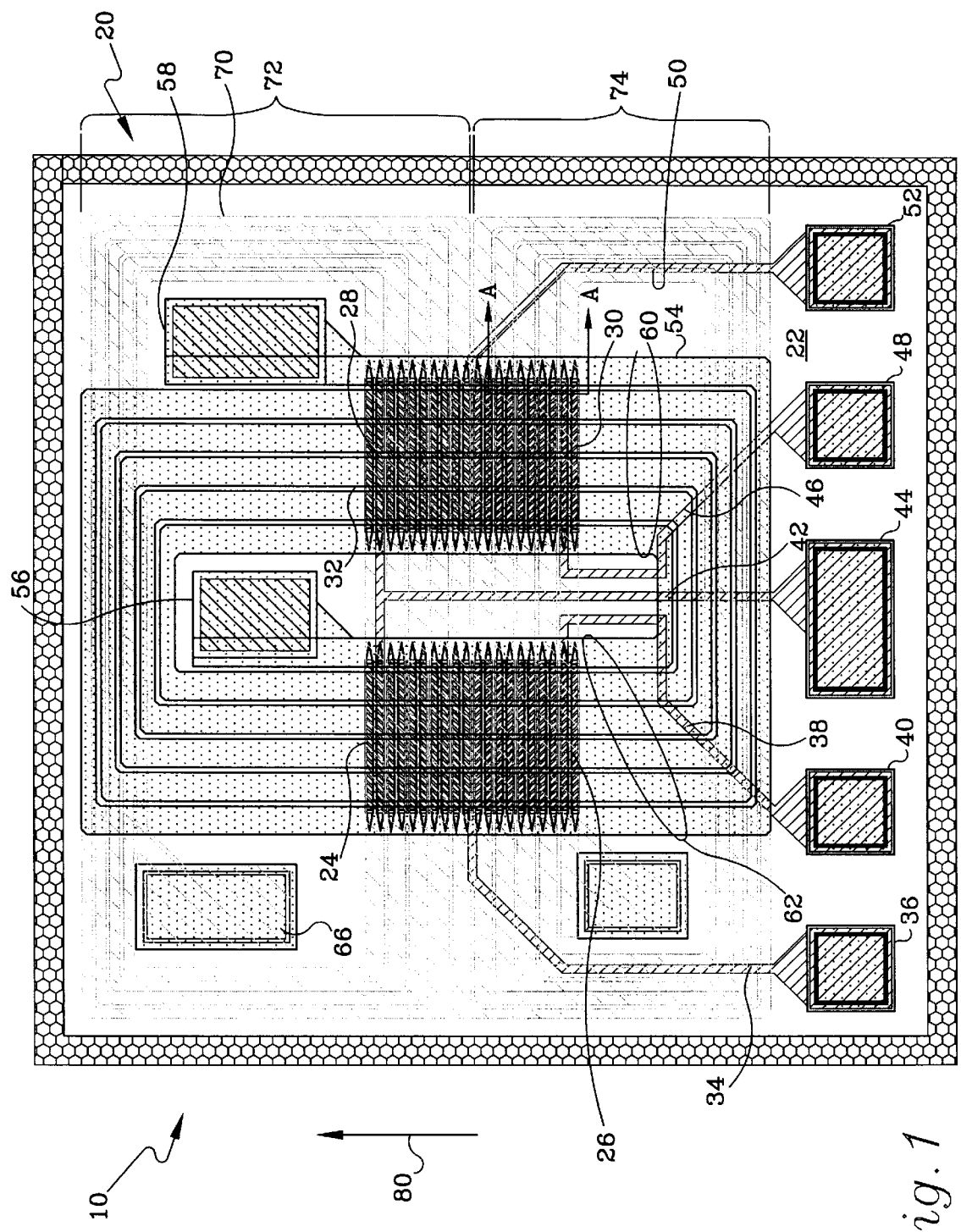
FIG. 1 shows a top plan view of a magnetic field sensing device according to the teachings of the present invention.

A device for sensing magnetic field in accordance with the present invention is shown in the drawings and generally designated 10. FIG. 1 shows an integrated circuit layout for a magnetic field sensor in accordance with the present invention. Magnetic field sensor 10 is formed on a semiconductor substrate 22 using integrated circuit techniques. Four magnetoresistive elements 24, 26, 28, and 30 which utilize "barber pole" biasing are arranged in a Wheatstone bridge configuration. Each of magnetoresistive elements 24, 26, 28, and 30 is an array of nine parallel positioned magnetoresistive strips 32 electrically connected in series with one another. Individual magnetoresistive strips 32 are connected within magnetoresisitive elements 24, 26, 28 and 30 by interconnections (not shown). A tenth outer strip in each array is not electrically connected. Substrate 22 has an insulating layer, typically of silicon dioxide and/or silicon nitride. Background information on magnetoresistive sensors and the details of the formation of parallel positioned magnetic strips 32 on substrate 22 to provide magnetoresistive elements 24, 26, 28 and 30 are described in U.S. Pat. No. 4,847,584 dated Jul. 11, 1989 to Bharat B. Pant and assigned to the same assignee as the present application. U.S. Pat. No. 4,847,584 is hereby incorporated by reference. U.S. Pat. No. 5,247,278 dated Sep. 21, 1993 and assigned to the same assignee as the present invention provides background information on the use of an integrated magnetic field sensing device and is hereby incorporated by reference.

Interconnect 34 connects the junction of element 24 and element 26 to pad 36. Interconnect 38 connects an end of element 26 to pad 40. Interconnect 42 connects pad 44 to element 24 and element 28. Interconnect 46 connects pad 48 to element 30. Interconnect 50 connects element 28 and element 30 to pad 52.

Elements 24, 26, 28 and 30 are connected into a wheatstone bridge arrangement. A voltage may be applied between pad 44 and the common connection of pad 40 and pad 48. A bridge output is them available between pad 36 and pad 52.

A set-reset conductor or current strap 54 is connected between pad 56 and pad 58. Conductor 54 is in the form of a spiral that extends in a clockwise direction between pad 58 and pad 56. Conductor 54 includes segments 60 which pass above magnetoresistive elements 28 and 30, and segments 62 which pass above magnetoresistive elements 24 and 26. With a current entering pad 56 and leaving at pad 58, the current in segments 60 will cause a magnetization in elements 28 and 30 in a direction towards a central part of die 20. The current in segment 62 will cause a magnetization in element 24 and 26 in a direction towards a central part of die 20. When the current direction is reversed, the current in segments 62 will cause a magnetization in elememts 24 and 26 in a direction away from a central part of die 20 and the current in segment 60 will cause a magnetization in elements 28 and 30 in a direction away from a central part of die 20.

Conductor or current strap 70 allows generation of a magnetic field in the sensitive direction of magnetoresistive elements 24, 26, 28 and 30. Conductor 70 extends from pad 66 to pad 68 and includes a portion 72 and a portion 74. Segments of portion 72 are spaced from and aligned with elements 24 and 28. Segments 78 of portion 74 are spaced from and aligned with elements 26 and 30.

Conductor 70 is uniquely adapted to produce a predictable field in the sensitive direction of magnetoresistive elements 24, 26, 28 and 30 while limiting the current required to produce such a field, and limiting the size of the device. For example, portion 72 is a clockwise spiral form, originating at pad 66. Segments 76 are of a width to approximately match a width of two magnetoresistive strips 32. Portion 74 is different in that it is in a counterclockwise spiral form terminating at pad 68. When a DC current enters at pad 68 and exits at pad 66, a field is created in a direction as shown by arrow 80 in FIG. 1.

The present invention considers space requirements and power requirements of conductor 70. For example, segments 76 of portion 72 are wider than the remaining portion. The resistance of the remaining portion is therefore somewhat higher than that of segments 76. An advantage that results from the present invention is that less space is required for the remaining portion of conductor 70. The present invention provides a conductor 70 that requires about 25% less space and uses about10% less power when compared to a same character single-spiral coil.

When a current flows from pad 66 through conductor 70 to pad 68 or in the opposite direction, this current produces a magnetic field in a direction perpendicular to magnetoresistive strips 32 or in the direction to which magnetoresistive strips 32 are sensitive. This current then will unbalance the bridge and provide an output voltage at pads 36 and 52. Thus when the geometry of device 10 is known, one can determine by calculation what magnetic field is produced at magnetoresistive elements 24, 26, 28, and 30 by a given current in conductor 70. By then passing the given current through conductor 70 and measuring the output voltage at pads 36 and 52, one can determine the relationship between a known input or test magnetic field and the output voltage. Alternatively, one can calibrate conductor 70 by placing it in a known magnetic field and measuring the current required in conductor 70 to bring the output voltage to null.

Conductor 70 may also be used to produce a magnetic field at magnetoresistive elements for the purpose of offsetting or balancing out an existing external magnetic field. For example, device 10 may be in a location where a 1.0 gauss external field in one direction is being sensed and it may be desirable to null out or neutralize this external field so device 10 will see essentially a "0" field. A current may then be passed through conductor 70 to produce a 1.0 gauss field in the opposite direction and null out the external field.

In a feedback application conductor 70 can be used to keep device 10 at a "0" output condition. Here a variable current sufficient to oppose the varying external field would be passed through conductor 70. Measurement of the current required in conductor 70 would then be representative of the varying external magnetic field. The electronics required for the feedback circuitry may be placed outside of device 10 or integrated into device 10.

Figure 1A:
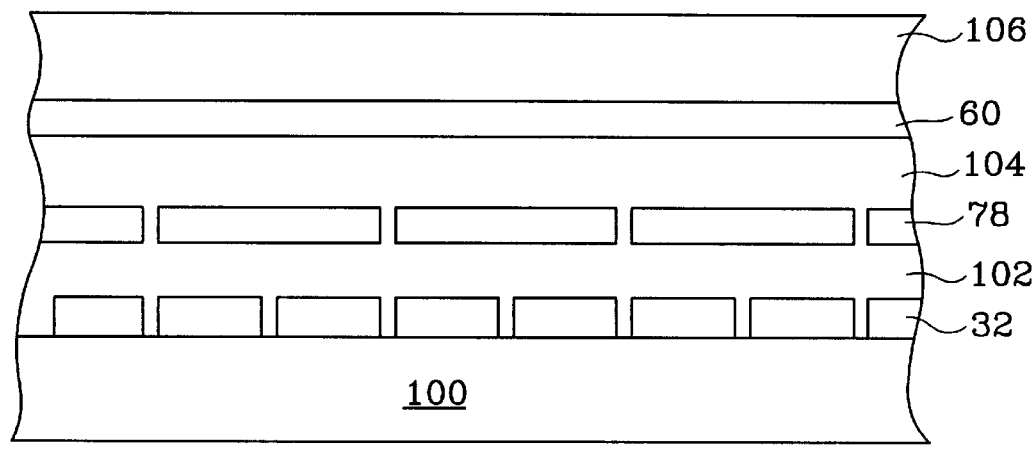
FIG. 1a shows a greatly enlarged cross sectional view of a portion of the device of FIG. 1 according to section line a—a.
Figure 4:
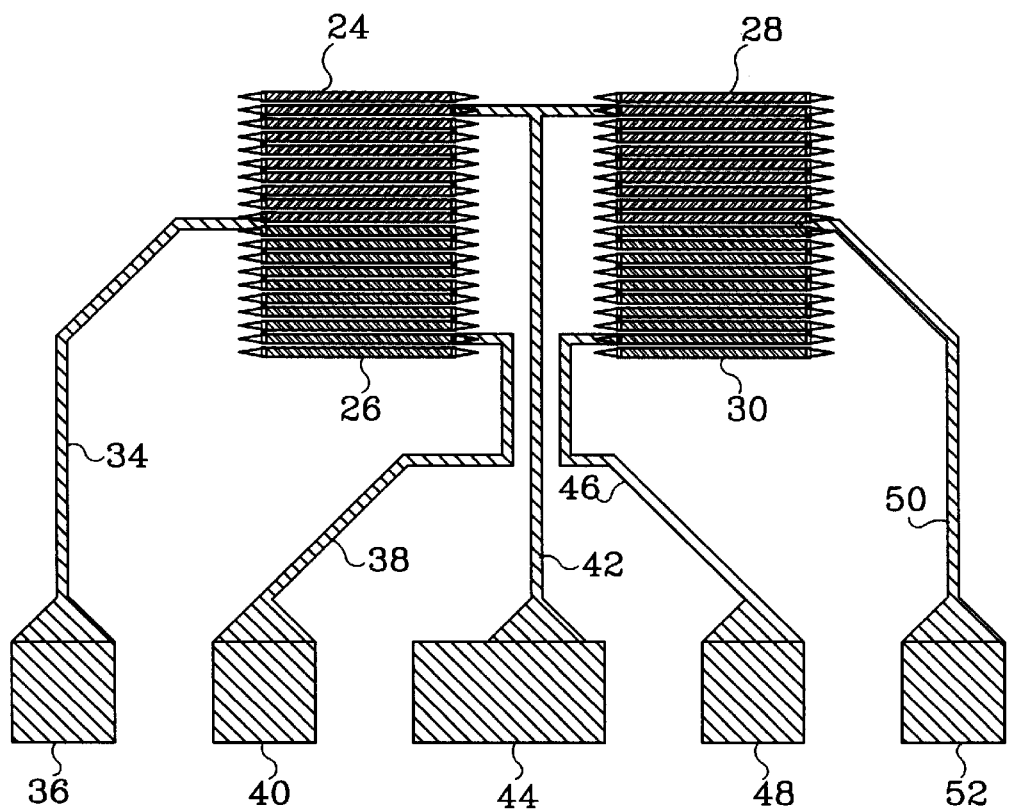
FIG. 4 is a plan view of a portion of the magnetic field sensing device shown in FIG. 1.
Figure 2:
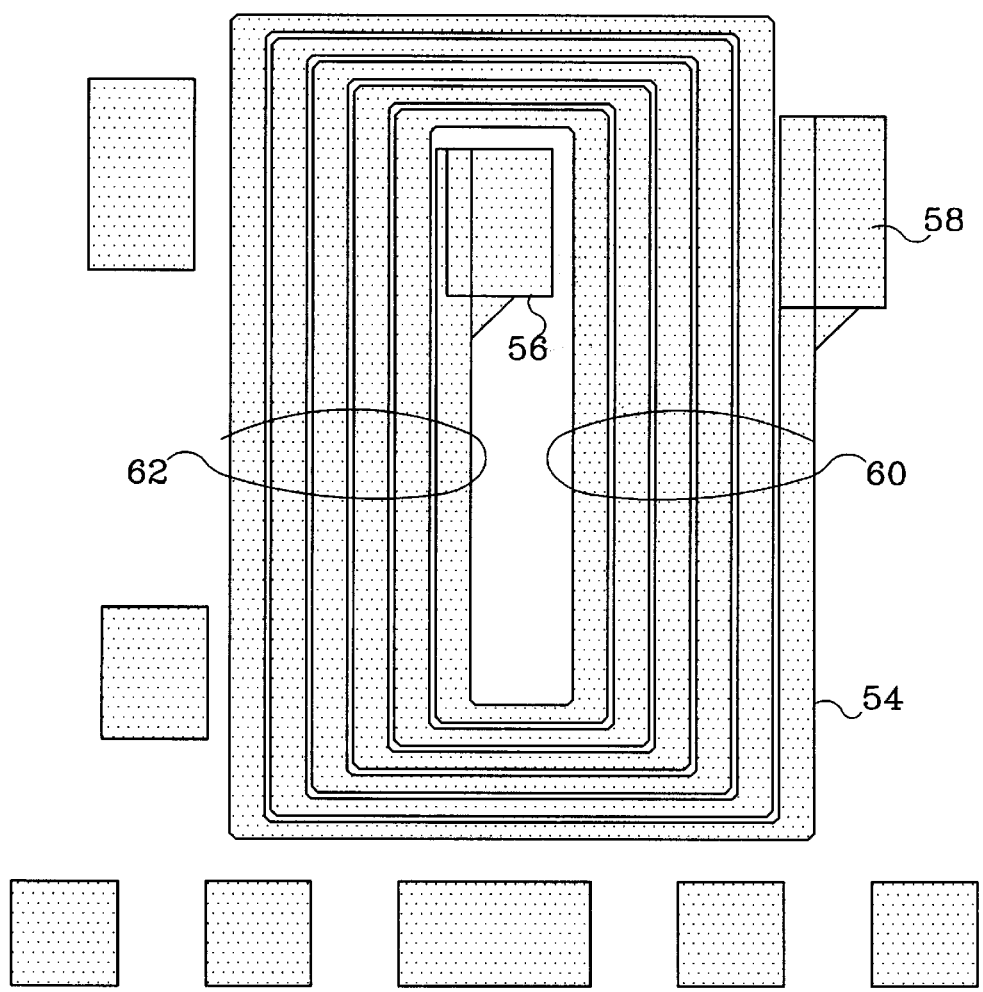
FIG. 2 is a plan view of a portion of the magnetic field sensing device shown in FIG. 1.
Figure 3:
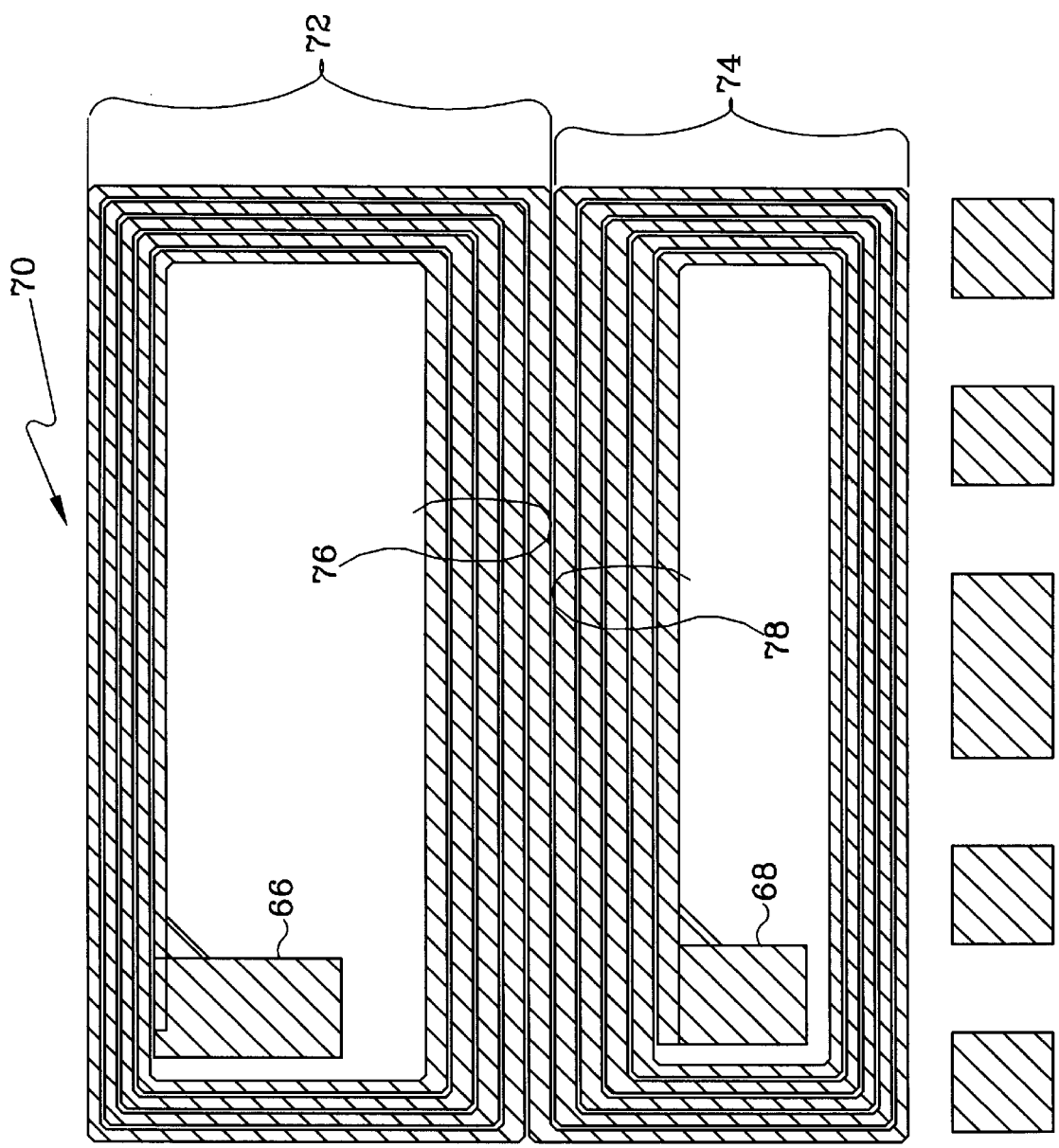
FIG. 3 is a plan view of a portion of the magnetic field sensing device shown in FIG. 1.

FIG. 1a shows a greatly enlarged cross sectional view of FIG. 1 along section a—a. Device 10 includes a silicon substrate 100, magnetoresistive strips 32, first dielectric 102, segments 78 of conductor 70, second dielectric 104, one of segments 60 and a passivation layer 106. The relative locations of the layers containing sensing elements, the set-reset strap and the offset strap may be varied provided attention is given to the magnetic fields produced by the straps.

While the present invention has been described in terms of a four leg Wheatstone bridge arrangement, it is to be understood that two-element bridges utilizing a single current source or utilizing two current sources may be used as well.

In addition to the dramatically lower current requirements of the present invention compared to the current requirements of current straps of the past, the present invention has other very significant advantages. A first advantage relates to null voltage. At zero magnetic field in direction 80 any voltage at pads 36 and 52 is a null voltage due to some mismatch in the resistance of elements 24, 26, 28 and 30.

Referring to FIG. 5, magnetoresistive sensors use magnetoresistive material such as a NiFe material 82 and 84. The NiFe material has a nonlinear transfer function and a barberpole technique is used to bias the material in the linear region by providing shorting bars, for example, 86 and 88 of a highly conductive material such as AlCu which is placed on NiFe material 82 and 84 at an angle of about 45°. The resistance of the material 82 and 84 then depends on the size of the NiFe strip, the number and size of the barberpoles, the space between barberpoles and the magnetoresistance. The magnetization is initially set in direction 90 and 92. In the presence of a magnetic field in the direction of 94, the magnetization will rotate to directions 96 and 98, and if 82 and 84 represent two elements connected to form the top half of a wheatstone bridge, an output voltage from the bridge will result.

In the absence of a magnetic field, any output of voltage from the bridge will be due to the mismatch of the resistance of the bridge elements. This mismatch comes about because of variations in the NiFe material thickness and line width of the NiFe and barberpole materials. This mismatch of resistance is estimated at less than 0.2%. However, where barberpole orientation is different for the legs of the upper half of the bridge, for example, in a 1×4 configuration, the mismatch of resistance may be as much as 0.7%.

A second advantage relates to reduced cross field effects. Cross field is a magnetic field in the sensor die plane and transverse to the sensitive direction of this sensor. The magnetic sensor is insensitive in this direction, but an existing cross field could result in a change in sensitivity and null voltage of the sensor. The output voltage $V_{out}$ of either a 1×4 configuration or a 2×2 configuration could be expressed as the following:

$$V_{out} = V_{bridge} \cdot S \cdot H$$

Where $V_{bridge}$ is the supplied voltage to the sensor, S, is the sensitivity and H is the magnetic field in the sensitive direction. Sensitivity is determined by MR ratio $\Delta R/R$ of the sensor material and a saturation field $H_s$, which is a combination of crystal and shape anisotropy fields.

$$S = \frac{\Delta R/R}{H_s}$$

Device 10 is a 2×2 design, which means that two pairs of legs, 24 and 28 or 26 and 30, in the bridge have opposite saturation fields. A cross field is parallel to the saturation field, it adds to one side and subtracts from the other. With a cross field $H_c$, the sensitivity S of the sensor changes. For a one-Oe cross field, the sensitivity was found to change about 0.3%.

In a 1×4 configuration, a cross field is a field adding on the top of the saturation field, it could increase or decrease the sensitivity depending on its polarity. with a cross field $H_c$, the sensitivity of the sensor changes. For a one-Oe cross field, the sensitivity was found to change about 12%. Alternating sensor output polarity for each measurement by using set and reset pulses, then subtracting the two readings in each measurement will greatly reduce the cross field error with a 1×4 configuration.

In accordance with the foregoing description, Applicants have developed a simple arrangement to set the direction of magnetization and to produce a magnetic field in the sensitive direction of a magnetic field sensor. Applicant's arrangement is easily incorporated into the design of integrated magnetic field sensors. Although a specific embodiment of Applicant's magnetization setting and magnetic field producing arrangement is shown and described for illustrative purposes, a number of variations and modifications will be apparent to those of ordinary skill in the relevant arts. It is not intended that coverage be limited to the disclosed embodiment, but only by the terms of the following claims.

What is claimed is:

1. An integrated device for sensing external magnetic fields comprising:

magnetic field sensing means having at least first and second magnetic field sensing elements and an output terminating region, said magnetic field sensing means being arranged to be sensitive to magnetic field components in a first direction and to provide an output signal at said output terminating region;

means for setting a direction of magnetization in said first magnetic field sensing element in a second direction and for setting a direction of magnetization in said second magnetic field sensing element in a third direction with said magnetic field sensing means providing an output signal at a first level; and for reversing said directions of magnetization in said first and second magnetic field sensing elements with said magnetic field sensing means then providing an output signal at a second level with the difference between said first output signal at a first level and said second output signal at a second level being representative of said external magnetic field components in a first direction; and means for producing a magnetic field in said first direction at said magnetic field sensing means comprising a first coil spaced from said first magnetic field sensing element and conducting a first current in a clockwise direction and a second coil spaced from said second magnetic field sensing element and conducting said first current in a counterclockwise direction.

2. Integrated device of claim 1 wherein said magnetic field sensing means is formed of an iron nickel alloy.

3. Integrated device of claim 2 wherein said means for producing a magnetic field is located between a layer comprising said means for setting a direction of magnetization and a layer comprising said magnetic field sensing means.

4. An integrated device for sensing external magnetic fields, comprising:

magnetic field sensing means having first, second, third, and fourth magnetoresistive elements, each of said magnetoresistive elements having first and second terminating regions, said first magnetoresistive element first terminating region being connected to said third magnetoresistive element first terminating region, said first magnetoresistive element second terminating region being connected to said second magnetoresistive element second terminating region, said third magnetoresistive element second terminating region being connected to said fourth magnetoresistive element second terminating region and said second magnetoresistive element first terminating region connected to said fourth magnetoresistive element first terminating region;

a first coil having a spiral shape and located so as to cause a magnetic field at said first and said third sensing elements in a second direction and to cause a magnetic field at said second and said fourth sensing elements, in a third direction, wherein said third direction is opposite said second direction; and a second coil spaced from said first and said third magnetic field sensing elements and conducting a first current in a clockwise direction and a third coil spaced from said second and said fourth magnetic field sensing elements and conducting said first current in a counterclockwise direction.

5. An integrated device for sensing external magnetic fields comprising:
- a substrate;
  - a magnetic field sensing layer comprising at least first and second magnetic field sensing elements and an output terminating region, said magnetic field sensing layer being arranged to be sensitive to magnetic field components in a first direction and to provide an output signal at said output terminating region;
  - a magnetization setting layer for setting a direction of magnetization in said first magnetic field sensing element in a second direction and for setting a direction of magnetization in said second magnetic field sensing element in a direction opposite said second direction and for reversing said directions of magnetization in said first and second magnetic field sensing elements; and
  - a magnetic field producing layer for producing a magnetic field in said first direction at said magnetic field sensing elements, said magnetic field producing layer comprising a first coil spaced from said first magnetic field sensing element and conducting a first current in a clockwise direction and a second coil spaced from said second magnetic field sensing element and conducting said first current in a counterclockwise direction, wherein one of said magnetic field sensing layer, said magnetization setting layer or said magnetic field producing layer is formed on said substrate.

6. An integrated device for sensing external magnetic fields, comprising:
- a magnetic field sensing layer having first, second, third, and fourth magnetoresistive elements, each of said magnetoresistive elements having first and second terminating regions, said first magnetoresistive element first terminating region being connected to said third magnetoresistive element first terminating region, said first magnetoresistive element second terminating region being connected to said second magnetoresistive element second terminating region, said third magnetoresistive element second terminating region being connected to said fourth magnetoresistive element second terminating region and said second magnetoresistive element first terminating region connected to said fourth magnetoresistive element first terminating region;
- a magnetization setting layer for setting a direction of magnetization in said first and said third magnetic field sensing elements in a second direction and for setting a direction of magnetization in said second and said fourth magnetic field sensing elements in a direction opposite said second direction and for reversing said directions of magnetization; and
- a magnetic field producing layer for producing a magnetic field in said first direction at said magnetic field sensing elements, said magnetic field producing layer comprising a first coil spaced from said first magnetic field sensing element and conducting a first current in a clockwise direction and a second coil spaced from said second magnetic field sensing element and conducting said first current in a counterclockwise direction, wherein one of said magnetic field sensing layer, said magnetization setting layer or said magnetic field producing layer is formed on said substrate.

* * * * *